(12) United States Patent
Gupta et al.

(10) Patent No.: US 7,820,985 B2
(45) Date of Patent: Oct. 26, 2010

(54) HIGH TILT IMPLANT ANGLE PERFORMANCE USING IN-AXIS TILT

(75) Inventors: Atul Gupta, Beverly, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 433 days.

(21) Appl. No.: 12/005,991

(22) Filed: Dec. 28, 2007

(65) Prior Publication Data

US 2009/0166566 A1  Jul. 2, 2009

(51) Int. Cl.
*G21K 5/08* (2006.01)
*G21K 5/10* (2006.01)

(52) U.S. Cl. .............. 250/491.1; 250/492.1; 250/492.2; 250/492.21; 250/492.3

(58) Field of Classification Search ............... 250/491.1, 250/492.1, 492.2, 492.21, 492.22, 492.3, 250/492.23; 438/471, 473, 514, 474, 510, 438/515, 519, 373, 480, 506, 659, 712, 766
See application file for complete search history.

(56) References Cited

U.S. PATENT DOCUMENTS

| | | | |
|---|---|---|---|
| 6,200,863 B1 | 3/2001 | Xiang et al. | |
| 6,437,350 B1 | 8/2002 | Olson et al. | |
| 6,437,351 B1 * | 8/2002 | Smick et al. | 250/492.21 |
| 6,677,599 B2 | 1/2004 | Berrian | |
| 6,777,695 B2 * | 8/2004 | Viviani | 250/492.21 |
| 6,949,796 B1 | 9/2005 | Ellis-Monaghan et al. | |
| 7,166,854 B2 | 1/2007 | Renau et al. | |
| 2001/0032937 A1 * | 10/2001 | Berrian | 250/492.2 |
| 2005/0263721 A1 * | 12/2005 | Renau et al. | 250/492.21 |
| 2006/0033046 A1 * | 2/2006 | Ferrara et al. | 250/492.21 |
| 2007/0023697 A1 * | 2/2007 | Purser et al. | 250/492.21 |
| 2007/0085037 A1 | 4/2007 | Chang et al. | |

* cited by examiner

*Primary Examiner*—Jack I Berman
*Assistant Examiner*—Nicole Ippolito Rausch

(57) ABSTRACT

The present invention comprises a method for high tilt angle implantation, with angular precision not previously achievable. An ion beam, having a width and height dimension, is made up of a number of individual beamlets. These beamlets typically display a higher degree of parallelism in one of these two dimensions. Thus, to minimize angular error, the workpiece is tilted about an axis substantially perpendicular to the dimension having the higher degree of parallelism. The workpiece is then implanted at a high tilt angle and rotated about a line orthogonal to the surface of the workpiece. This process can be repeated until the high tilt implantation has been performed in all required regions.

23 Claims, 12 Drawing Sheets

HIGH TILT IMPLANT ANGLE PERFORMANCE USING IN-AXIS TILT

BACKGROUND OF THE INVENTION

Ion implanters are commonly used in the production of semiconductor wafers. An ion source is used to create a beam of positively charged ions, which is then directed toward the workpiece. As the ions strike the workpiece, they change the properties of the workpiece in the area of impact. This change allows that particular region of the workpiece to be properly "doped". The configuration of doped regions defines the functionality of the workpiece, and through the use of conductive interconnects, these workpieces can be transformed into complex circuits.

In many applications, the ion beam is directed so as to strike the workpiece in a direction normal to the plane of the workpiece. FIG. 1 shows a representative orientation of workpiece 100 in three dimensions, X, Y and Z. In many applications, the ion beam (not shown) is directed toward the workpiece 100 in a direction substantially parallel to the Z axis. In this manner, the ion beam is substantially perpendicular to the workpiece in both the X and Y axes. The ion beam can be thought of as a set of ion beamlets, each beamlet comprising a single line in the XZ plane. While it is important that the entire beam is substantially perpendicular to the workpiece, it is equally important that each of the individual beamlets is also perpendicular to the workpiece in both the X and Y axes. FIG. 2a shows an ion beam 200 which is made up of a plurality of beamlets 210. Although only several are shown for purposes of illustration, the ion beam can be comprised of an arbitrary number of beamlets. In this Figure, all of the beamlets 210 are parallel to one another. In contrast, FIG. 2b shows an ion beam 250, which is also substantially perpendicular to the workpiece. However, its component ion beamlets 270 are not parallel to one another, and consequently some of these beamlets are not perpendicular to the workpiece.

Since an ion beam is a three dimensional entity, parallelism exists in several dimensions. For example, ion beamlets can be parallel across the X dimension (i.e. the XZ plane). In this dimension, deviations in the Y dimension are not considered. Similarly, ion beamlets can be parallel across the Y dimension (i.e. YZ plane), where deviations in the X dimension are not considered. It should be obvious to one of ordinary skill in the art that the ion beamlets of an ion beam can display parallelism in one dimension (i.e. width) without displaying parallelism in the orthogonal dimension (i.e. height). While this issue is well known in the art, it is not considered important, since the mechanical movement of the workpiece support ensures that all portions of the workpiece are exposed to the beam.

U.S. Pat. No. 6,437,350, which is incorporated herein by reference, discloses an apparatus and method of maintaining the desired degree of parallelism between the ion beamlets. Those of ordinary skill in the art will appreciate that parallelism is typically controlled via an angle corrector, such as a magnet. However, the optimal setting for beamlet parallelism may occur at an incident angle other than 90°. To correct for this, the workpiece is tilted about a line parallel to the Y axis. As shown in FIG. 3, the ion beam exits the angle corrector 330. Because of the magnetic fields created by the angle corrector 330, the beamlets 310 of ion beam 300 are parallel to one another. However, their angle of incidence is not orthogonal to the workpiece 320. To rectify this, workpiece 320 is pivoted about a line at an angle 340. In this way, the ion beam 300 strikes the workpiece 320 perpendicularly.

Certain applications require that the ion beam strike the workpiece with an incident angle other than 90°, such as at large tilt angles. In one embodiment, high tilt implantation, such as halo or pocket implantation, is used to create dopant pockets underneath the edge of the gate device. FIG. 4 shows a representative transistor structure 400, comprising a gate region 410, atop a substrate 420. The source region 430 and drain region 440 lie on either side of the gate region 410. To extend the source and drain regions beneath the gate edge, the ion beam impacts the substrate at a significant tilt angle, as demonstrated by directional arrows 450a and 450b. This tilt angle is typically between about 5 and about 60 degrees.

This high tilt implantation is achieved by manipulating the workpiece in several dimensions. FIG. 5 demonstrates a preferred method in the prior art of performing these steps. FIG. 5 shows workpiece 500, which is substantially aligned with the XY plane. The ion beam 510 is substantially parallel to the Z axis, and is perpendicular to the workpiece 500. As described above, the workpiece 500 is pivoted about a line parallel to the Y axis to insure that the ion beam strikes the workpiece at a 90° angle. To achieve the high tilt implantation, the workpiece is then pivoted about a line that is parallel to the X axis. The workpiece is then scanned by the ion beam 510 in the traditional manner. Traditionally, the beam is scanned back and forth in the x direction either electrostatically or by using a magnet, and the workpiece is translated in the y direction relative to the beam. The magnetic or electrostatic scan is usually referred to as fast scan, the mechanical scan as slow scan. Alternatives include replacing the fast scan with a ribbon beam, and replacing the fast electrostatic or magnetic scan with a mechanical scan (2D mechanical scanning). When the workpiece has been scanned, the workpiece has been implanted at a high tilt angle, such as 450a as shown in FIG. 4.

To implant ions at the incident angle represented by 450b as shown in FIG. 4, it is necessary to rotate the workpiece again. In this case, the workpiece is preferably rotated about a line that is perpendicular to the surface of the workpiece. A rotation of 180° is needed to generate the incident angle represented by 450b.

This combination of movements about three separate axes allows the workpiece to be implanted at high tilt angles. Despite the precision movements described above, it is difficult to achieve angular precision within ±0.5 degrees. Thus, an implantation angle of 60° may actually be between 59.5° and 60.5°. As the geometries continue to decrease in size, it is becoming more and more important to have precise control over each of these angles, especially the angle of incidence. Thus, the amount of deviation in conventional processes is becoming unacceptably high.

SUMMARY OF THE INVENTION

The problems of the prior art are overcome with the present invention, which comprises a method and apparatus for high tilt angle implantation, resulting in angular precision not previously achievable.

An ion beam, having a width and height dimension, is made up of a number of individual beamlets. These beamlets are typically more precisely controlled in one of these two dimensions, thereby exhibiting a higher degree of parallelism between the beamlets. Thus, to minimize angular error, the workpiece, such as a semiconductor workpiece, is tilted about a line substantially perpendicular to the dimension having the higher degree of parallelism. The workpiece is then implanted and rotated about a line orthogonal to the surface of the workpiece. This process can be repeated until the high tilt implantation has been performed in all required regions.

In one embodiment, the direction of the beamlets displays a higher degree of parallelism along the width of the ion beam. Therefore, the workpiece is tilted about an axis orthogonal to the width. In another embodiment, the higher degree of parallelism occurs along the height of the ion beam. In this embodiment, the workpiece is tilted about an axis orthogonal to the height.

In a further embodiment, a scanned ion beam is used. The width of this beam is varied based on the tilt angle desired, such that the beam width decreases as the tilt angle increases.

In a further embodiment, portions of the workpiece such as halo implants and single sided buried straps are selectively implanted. The wafer is tilted about an axis perpendicular to the dimension having the higher degree of parallelism. The workpiece is then manipulated so as to orient the portion in a position to be exposed to the ion beam.

DETAILED DESCRIPTION

Figure 6:
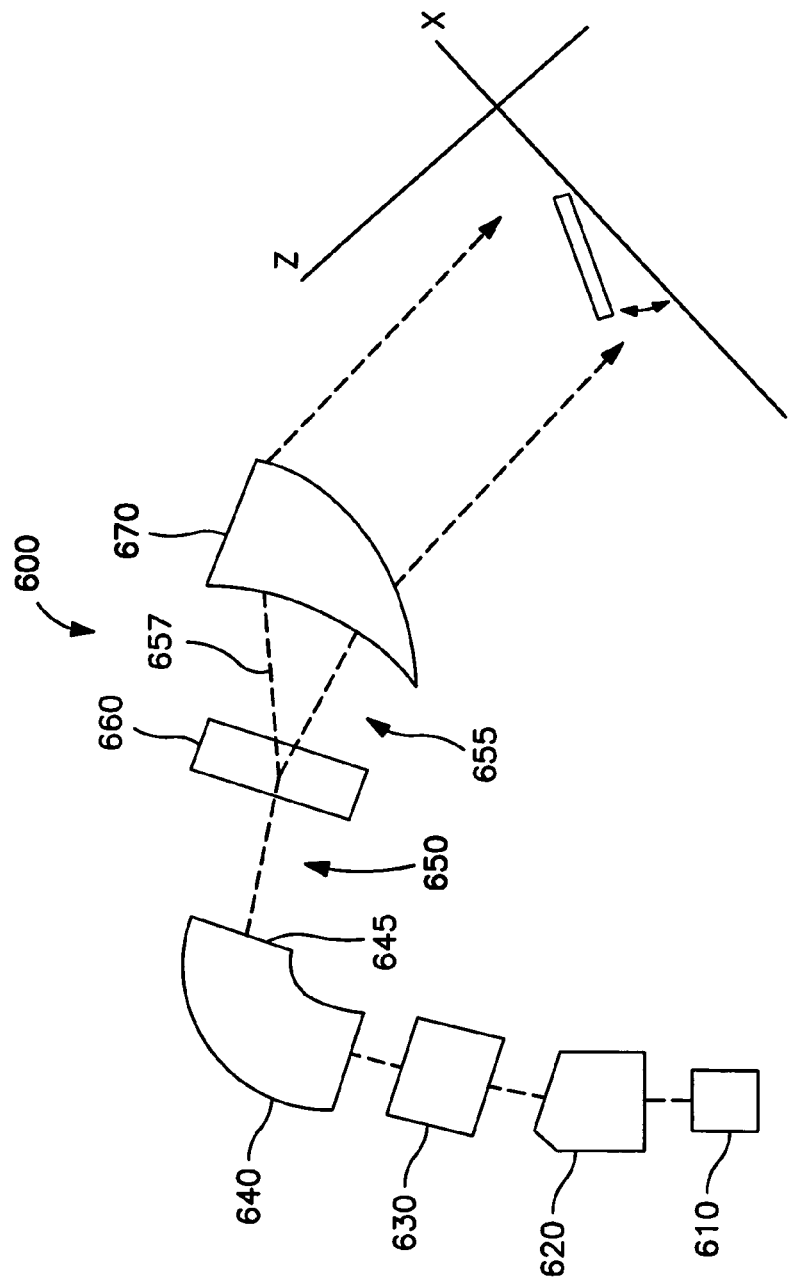
FIG. 6 shows a representative schematic diagram of an ion implanter suitable for implementing the present invention.

As described above, an ion beam is used to implant ions into a workpiece, such as a semiconductor wafer. A block diagram of a representative ion implanter 600 is shown in FIG. 6. An ion source 610 generates ions of a desired species, such as arsenic or boron. These ions are formed into a beam, which then passes through a source filter 620. The source filter is preferably located near the ion source. The ions within the beam are accelerated/decelerated in column 630 to the desired energy level. A mass analyzer magnet 640, having an aperture 645, is used to remove unwanted components from the ion beam, resulting in an ion beam 650 having the desired energy and mass characteristics passing through resolving aperture 645.

In certain embodiments, the ion beam 650 is a spot beam. In this scenario, the ion beam passes through a scanner 660, preferably an electrostatic scanner, which deflects the ion beam 650 to produce a scanned beam 655 wherein the individual beamlets 657 have trajectories which diverge from scan source 665. In certain embodiments, the scanner 660 comprises separated scan plates in communication with a scan generator. The scan generator creates a scan voltage waveform, such as a sine, sawtooth or triangle waveform having amplitude and frequency components, which is applied to the scan plates. In a preferred embodiment, the scanning waveform is typically very close to being a triangle wave (constant slope), so as to leave the scanned beam at every position for nearly the same amount of time. Deviations from the triangle are used to make the beam uniform. The resultant electric field causes the ion beam to diverge as shown in FIG. 6.

An angle corrector 670 is adapted to deflect the divergent ion beamlets 657 into a set of beamlets having substantially parallel trajectories. Preferably, the angle corrector 670 comprises a magnet coil and magnetic pole pieces that are spaced apart to form a gap, through which the ion beamlets pass. The coil is energized so as to create a magnetic field within the gap, which deflects the ion beamlets in accordance with the strength and direction of the applied magnetic field. The magnetic field is adjusted by varying the current through the magnet coil. Alternatively, other structures, such as parallelizing lenses, can also be utilized to perform this function.

Figure 1:
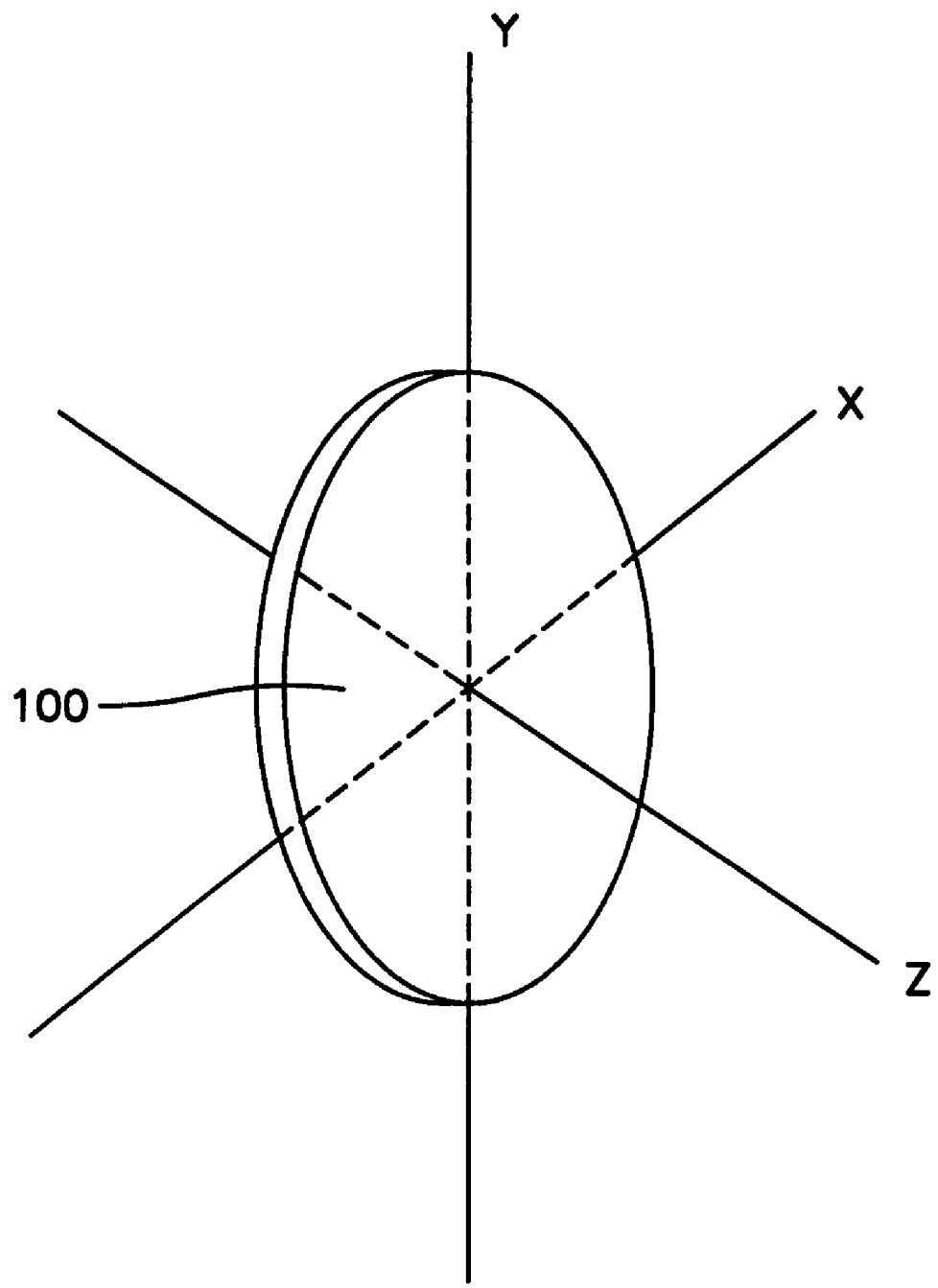
FIG. 1 shows a coordinate system used to describe the orientation of a semiconductor workpiece.
Figure 2A:
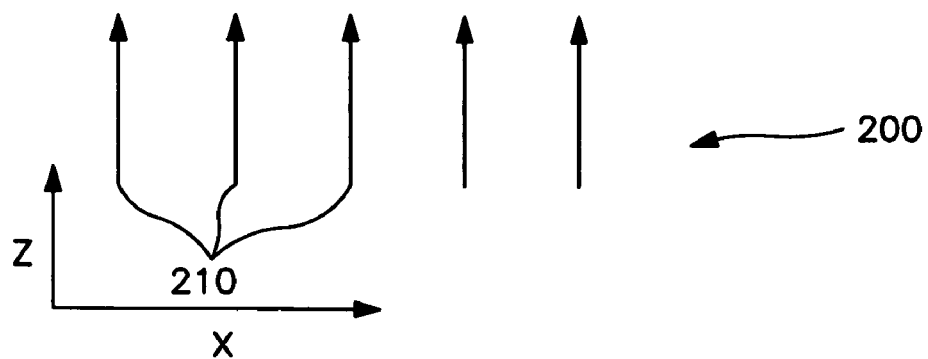
FIG. 2a shows a representation of an ion beam, comprising a number of ion beamlets.
Figure 2B:
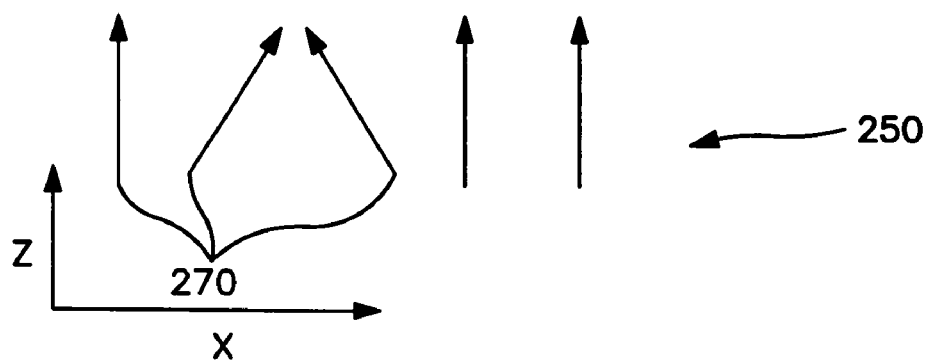
FIG. 2b shows a second representation of an ion beam comprising a number of ion beamlets.
Figure 3:
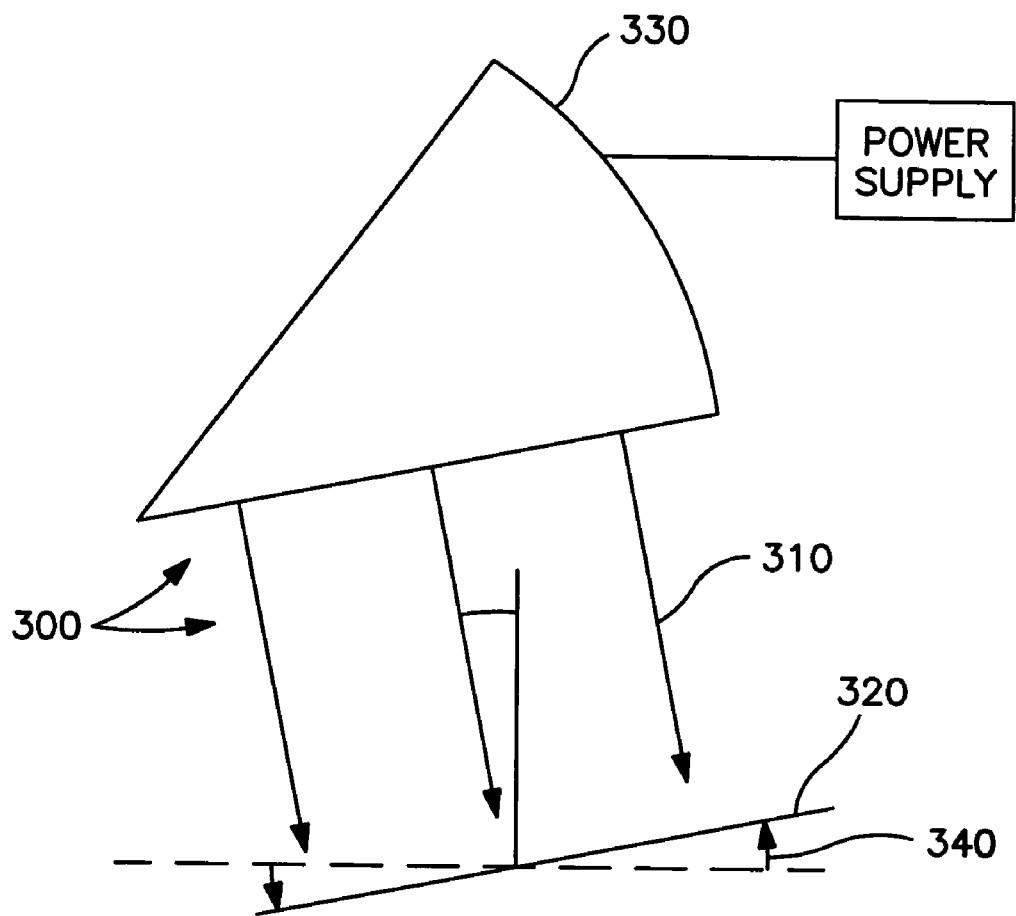
FIG. 3 shows the movement of the workpiece to maximize ion beamlet parallelism, as performed in the prior art.
Figure 4:
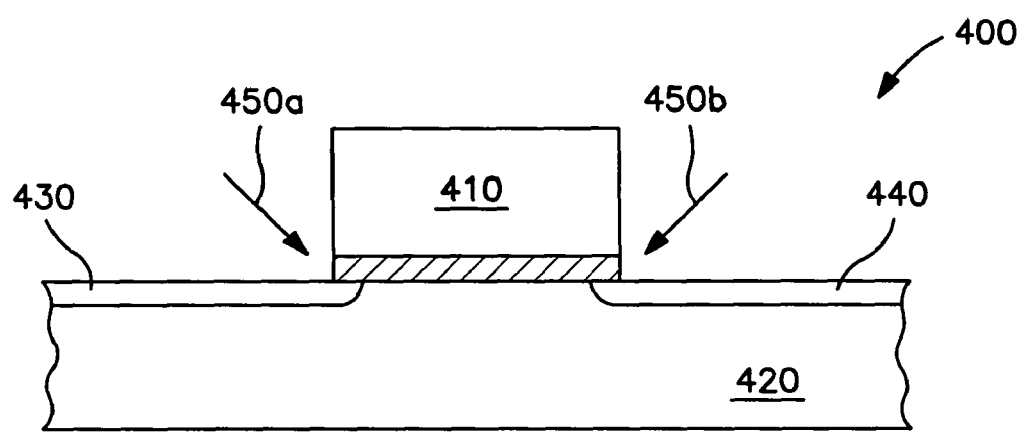
FIG. 4 shows a representative semiconductor device and several high tilt implantation angles.

It is important to note that the beam scanner 660 and angle corrector 670 contain plates between which the ion beamlets pass. Because of this arrangement, the beam can be tightly controlled in the plane defined between the sets of plates. However, limited control is possible in the dimension orthogonal to that plane. Thus, with reference to the angle corrector 670, the plates are spaced so as to create a gap that is preferably in the XZ plane (as defined by the coordinate system of FIG. 1). Therefore, the beamlet control is most tightly controlled in this dimension, allowing the angle corrector to redirect the individual ion beamlets to cause them to be parallel to one another in the X dimension. The individual beamlets are not controlled in the Y direction, causing them to be less parallel than those in the X dimension. Parallel is typically defined as being equidistant everywhere and never crossing. The term "degree of parallelism" is used to represent the extent to which a set of ion beamlets approaches being parallel. The term "dimension having the higher degree of parallelism" is be used to denote the dimension where the ion beamlets are more closely parallel. In other words, in this dimension, the ion beamlets show less divergence and are more tightly controlled. In the system shown in FIG. 6, the dimension having the higher degree of parallelism is the X dimension, due to the operation of the beam scanner 660 and angle corrector 670.

Following the angle corrector 670, the scanned beam is targeted toward the workpiece. The workpiece is attached to a workpiece support. The workpiece support provides a variety of degrees of movement. For example, the workpiece support can be turned about a line that passes through the center of the workpiece and is parallel to any of the three major axes. Thus, by pivoting about a line parallel to the X axis, the workpiece support allows tilting of the workpiece such that the top half of the workpiece is tilted toward or away from the ion source relative to the bottom half. Similarly, by pivoting about a line parallel to the Y axis, the workpiece support allows tilting of the workpiece such that the left half of the workpiece is tilted toward or away from the ion source relative to the right half. Finally, the workpiece support allows rotation about a line perpendicular to the surface of the workpiece, so as to create a clockwise or counterclockwise movement of the workpiece surface. These movements are not mutually exclusive, the workpiece support can be manipulated in any combination of directions simultaneously. Additionally, the workpiece support also provides translational movement, typically in the Y direction, so as to expose the entire workpiece to the ion beam. As described above, the workpiece may be tilted about a line parallel to the Y axis to maximize the parallelism of the ion beamlets. This is achieved through tilting of the workpiece support as described above. Also, to achieve the high tilt incidence angles used for halo implantation, the workpiece is traditionally tilted about a line parallel to the X axis, by a tilting of the workpiece support, as shown in FIG. 5.

High tilt angle implantation is typically achieved via a four step process. FIG. 7 shows a representative workpiece 700 having two transistors 710, 720, where transistor 710 is oriented with its length in the vertical direction, while transistor 720 is oriented with its length in the horizontal direction. While only two transistors are shown, it is obvious to one of ordinary skill in the art that a workpiece may contain an arbitrary number of transistors.

Figure 5:
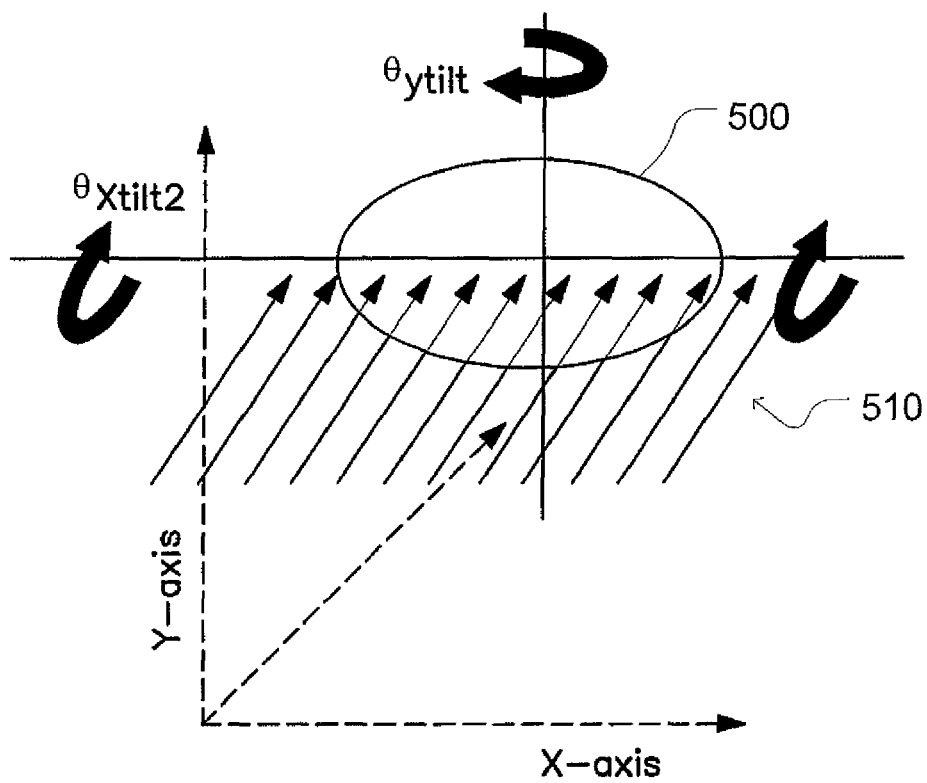
FIG. 5 shows a workpiece tilted about both the X and Y axes in the high tilt implantation process of the prior art.
Figure 7A:
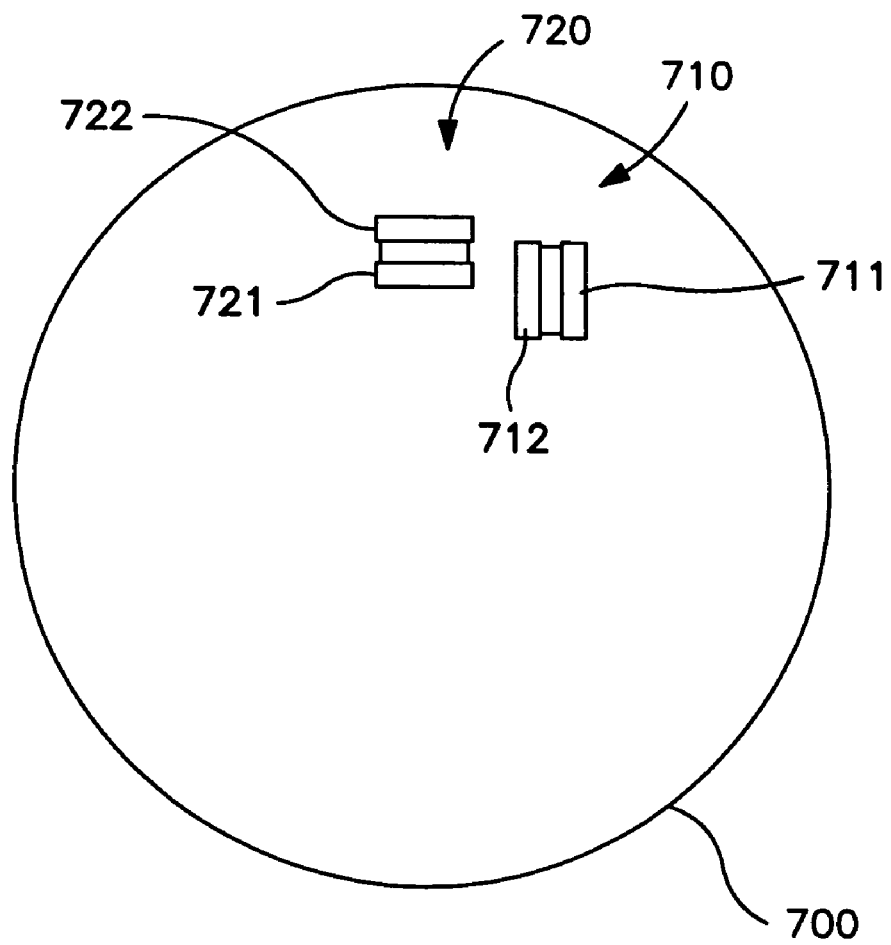
FIG. 7a shows a workpiece containing two representative transistor structures as presented during the first process step.

In the prior art, as shown in FIG. 5, the workpiece support (and therefore the workpiece) is pivoted about a line substantially parallel to the X axis in anticipation of high tilt implantation. Referring to FIGS. 7*a-d*, assume that as a result of this pivot, the upper portion of the workpiece is tilted backward (into the page), while the bottom is tilted forward (coming out of the page). During the first step of the process, the workpiece is presented with the transistors oriented as shown in FIG. 7*a*. Thus, when the workpiece is exposed to an ion beam, ions are implanted along the lower gate edge 721 of transistor 720. Due to the high incident angle, these ions penetrate beneath the gate device. The upper gate edge 722 of transistor 720 is not implanted, as the gate structure itself blocks the ion beam. At this time, the ion beam directed at transistor 710 is inconsequential, since halo implantation is predominantly concerned with the region along the length of the gate, not along its width.

Figure 7B:
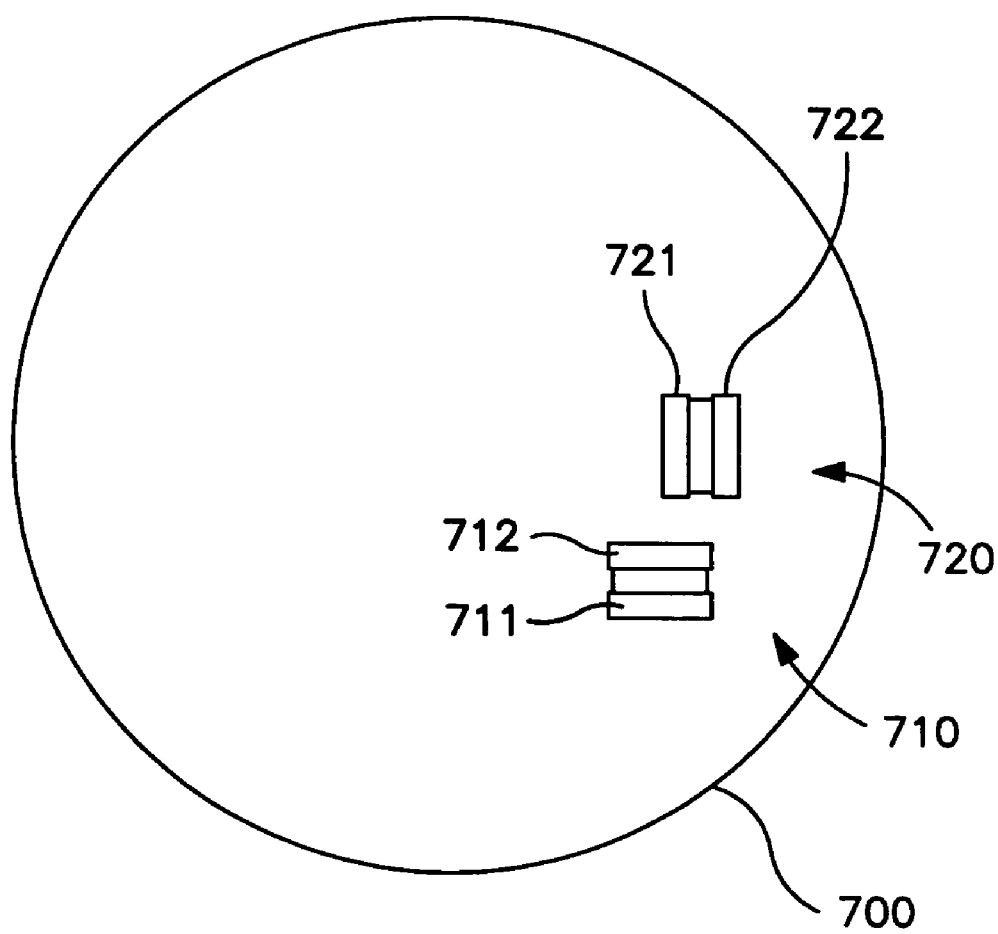
FIG. 7b shows a workpiece containing two representative transistor structures as presented during the second process step.

In a second step of the process, the workpiece is rotated 90°, in a clockwise direction for example, about a line perpendicular to the workpiece surface, preferably a line that passes through the center of the workpiece. Thus, the two transistors would appear on the workpiece as shown in FIG. 7*b*. During this process step, when the workpiece is exposed to an ion beam, ions are implanted along the lower gate edge 711 of transistor 710. The upper gate edge 712 of transistor 710 is not implanted. At this time, the ion beam directed at transistor 720 is inconsequential, since halo implantation is predominantly concerned with the region along the length of the gate, not along its width.

Figure 7C:
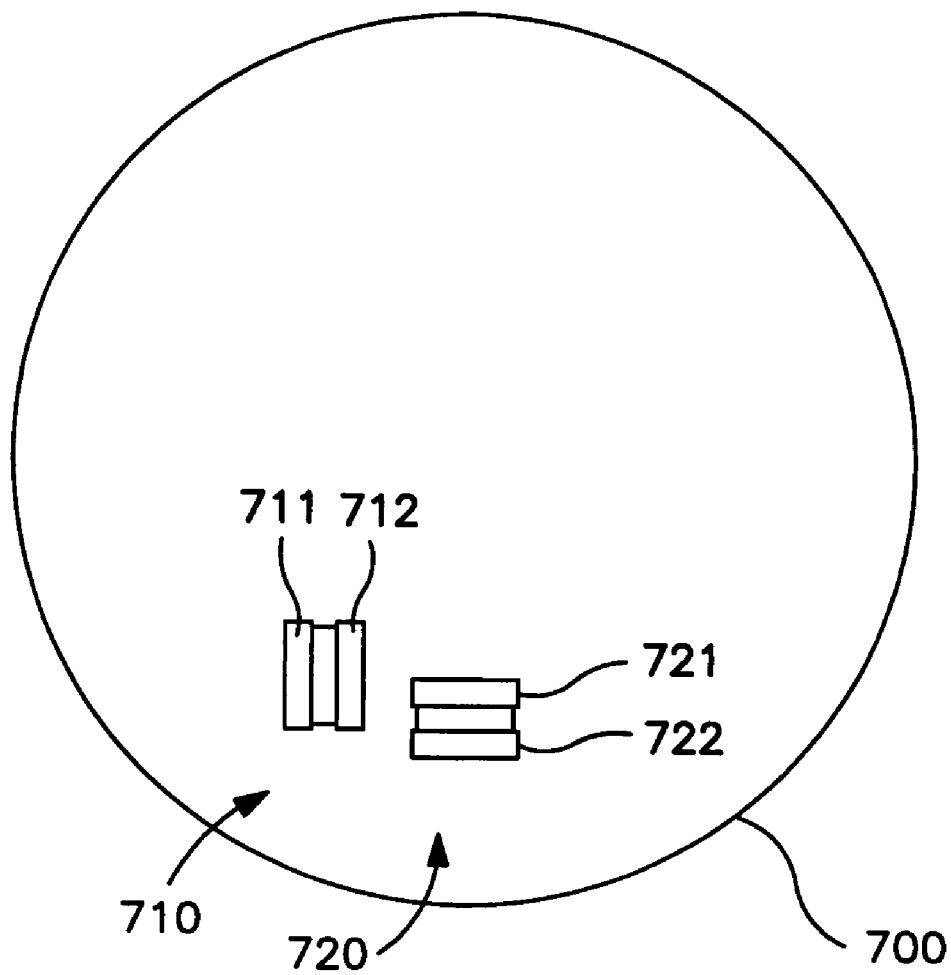
FIG. 7c shows a workpiece containing two representative transistor structures as presented during the third process step.

In a third step of the process, the workpiece is again rotated 90°, in a clockwise direction. Thus, the two transistors would appear on the workpiece as shown in FIG. 7*c*. During this process step, when the workpiece is exposed to an ion beam, ions are implanted along the upper gate edge 722 of transistor 720. The lower gate edge 721 of transistor 720 is not implanted. Again, at this time, the ion beam directed at transistor 710 is inconsequential.

Figure 7D:
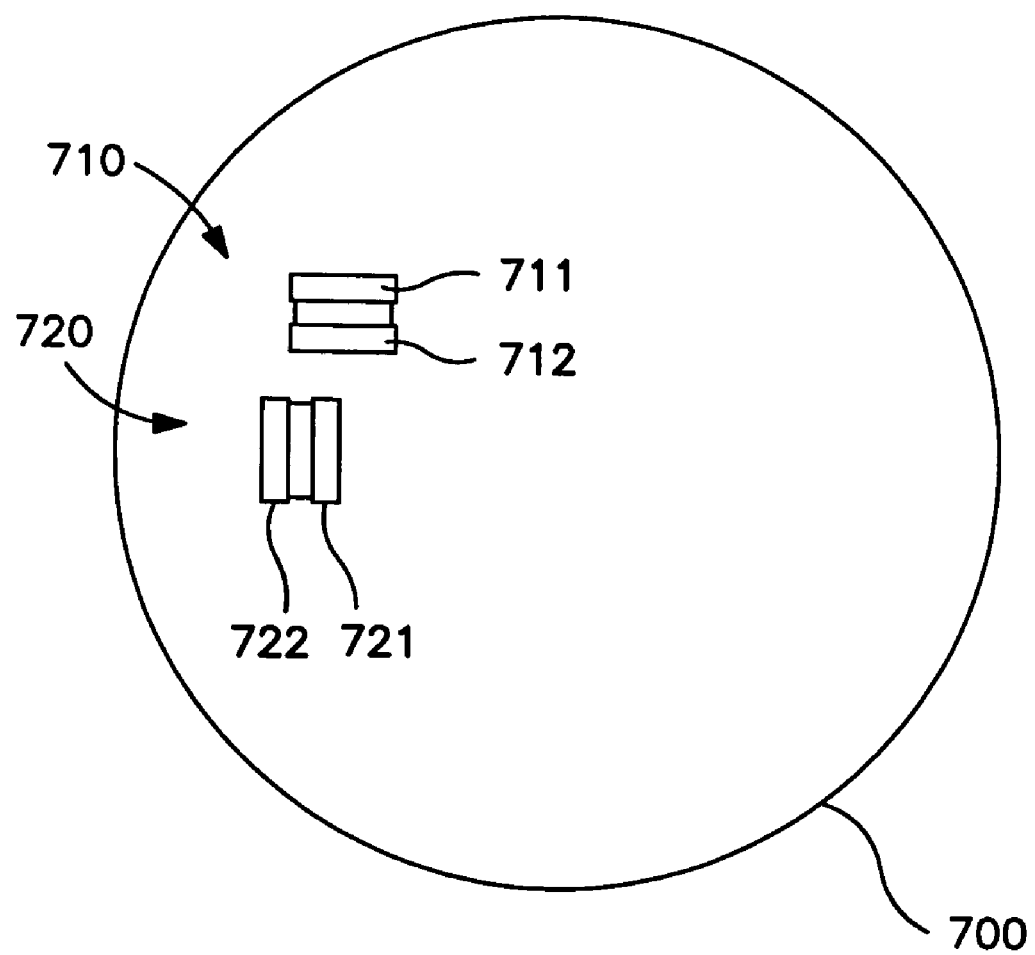
FIG. 7d shows a workpiece containing two representative transistor structures as presented during the fourth process step.

Finally, in a fourth step of the process, the workpiece is rotated 90°, in a clockwise direction. Thus, the two transistors would appear on the workpiece as shown in FIG. 7*d*. During this process step, when the workpiece is exposed to an ion beam, ions are implanted along the upper gate edge 712 of transistor 710. The lower gate edge 711 of transistor 710 is not implanted. Again, at this time, the ion beam directed at transistor 720 is inconsequential.

Thus, by performing this four-step process, using 4 rotations about an axis perpendicular to the surface of the workpiece, the gate edges for all transistors, regardless of their axis of orientation, can be implanted. Note that horizontally oriented transistor 720 is implanted during steps 1 and 3, while the vertically oriented transistor 710 is implanted during process steps 2 and 4.

Figure 8A:
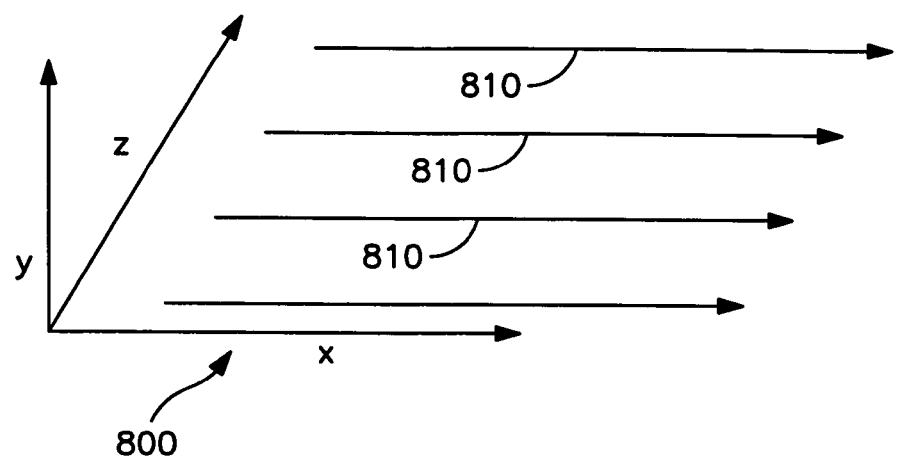
FIG. 8a shows an ideal ion beam having parallel and coplanar ion beamlets.
Figure 8B:
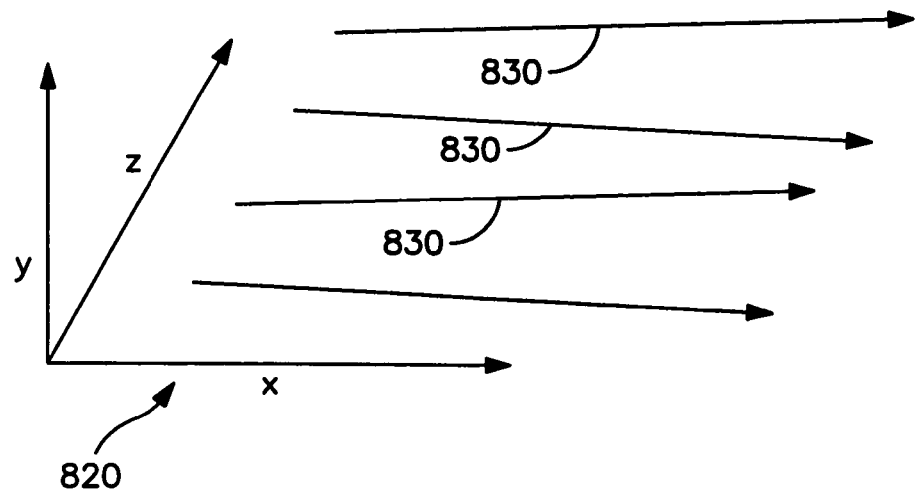
FIG. 8b shows an ion beam having parallel, but not coplanar ion beamlets.

As described above, the angle corrector 670 comprises plates between which the ion beamlets pass. As stated above, because of this configuration, the beam can be tightly controlled in the plane defined between the sets of plates. However, limited control is possible in the dimension orthogonal to that plane. Thus, while the ion beamlets are parallel to one another in the X dimension (i.e. the XZ plane), these beamlets may not be parallel to one another in the Y dimension (i.e. the YZ plane). FIG. 8*a* shows an example of a scanned ion beam 800, comprising a number of beamlets 810. Note that the angle corrector 670 has made the trajectories of the beamlets nearly parallel. In fact, using detection techniques described in U.S. Pat. No. 6,437,350, it is possible to control the angular deviation of the ion beamlets very tightly, such as to within ±0.1°. However, this level of control is not possible in the Y dimension. FIG. 8*b* shows an ion beam 820, but illustrates that the beamlets 830, while appearing parallel in the XZ plane, are not parallel in the Y dimension. Note that individual beamlets may have a Y component to their trajectory, leading to a deviation in the parallelism of the ion beam in the Y dimension (i.e. the YZ plane). While the deviation may not be significantly large, it is much greater than the deviation that exists in the XZ plane. Thus, the ion beam 820 shows a higher degree of parallelism in the X dimension. Furthermore, the system described in FIG. 6 has no mechanism to measure or control the deviation in the Y dimension.

Referring to FIGS. 7*a-d*, note that the angle of consequence is based on the incident angle of the ion beam and the pivoting of the workpiece about a line parallel to the X axis. Thus, the precision of this angle is determined by the parallelism of the ion beam in the Y dimension, and the accuracy of the tilt mechanism. As stated above, the parallelism of the ion beam in the Y dimension cannot be controlled and it is anticipated that deviations in parallelism in this dimension can result in individual ion beamlets having divergences in trajectory of as much as a degree.

As was described earlier, the ion implanters shown in FIG. 6 are capable of controlling and measuring the parallelism of the ion beamlets in the X dimension (i.e. the XZ plane) to a very high degree. Consequently, angular movement about a line that is substantially parallel to the Y axis result in precisely controlled measurements and angle distributions. This characteristic is utilized in the prior art to insure that the ion beam perpendicularly strikes the workpiece relative to Y-axis. This characteristic is likewise used in the present invention to generate precisely controlled incident angles during high tilt angle implantation. The present invention tilts about an axis perpendicular to the dimension of the ion beam having the higher degree of parallelism.

Referring back to FIGS. 7*a-d*, suppose that the workpiece is now tilted about the vertical axis, such that the left side of the workpiece is tilted into the page and the right side of the workpiece is tilted forward (out of the page), so as to create the required incident angle for halo implantation. During the first step of the process, the workpiece is presented in the orientation seen in FIG. 7*a*. Thus, when the workpiece is exposed to an ion beam, ions are implanted along and under the right gate edge 711 of transistor 710. The left gate edge 712 of transistor 710 is not implanted, as the gate structure itself blocks the ion beam. At this time, the ion beam directed at transistor 720 is inconsequential, since halo implantation is predominantly concerned with the region along the length of the gate, not along its width.

In a second step of the process, the workpiece is rotated 90°, in a clockwise direction for example, about a line perpendicular to the workpiece surface. Thus, the two transistors would appear on the workpiece as shown in FIG. 7b. During this process step, when the workpiece is exposed to an ion beam, ions are implanted along the right gate edge 722 of transistor 720. The left gate edge 721 of transistor 720 is not implanted. At this time, the ion beam directed at transistor 710 is inconsequential.

In a third step of the process, the workpiece is again rotated 90°, in a clockwise direction. Thus, the two transistors would appear on the workpiece as shown in FIG. 7c. During this process step, when the workpiece is exposed to an ion beam, ions are implanted along the left gate edge 712 of transistor 710. The right gate edge 711 of transistor 710 is not implanted. Again, at this time, the ion beam directed at transistor 720 is inconsequential.

Finally, in a fourth step of the process, the workpiece is rotated 90°, in a clockwise direction. Thus, the two transistors would appear on the workpiece as shown in FIG. 7d. During this process step, when the workpiece is exposed to an ion beam, ions are implanted along the left gate edge 721 of transistor 720. The right gate edge 722 of transistor 720 is not implanted. Again, at this time, the ion beam directed at transistor 710 is inconsequential.

Note that horizontally oriented transistor 720 is implanted during steps 2 and 4, while the vertically oriented transistor 710 is implanted during process steps 1 and 3.

The difference between these two techniques is significant. In the former technique, the angle of incidence is based on the parallelism of the ion beam in the Y dimension (YZ plane) and the precision of the workpiece support movement. In the latter technique, the angle of incidence is based on the parallelism of the ion beamlets in the X dimension (XZ plane) and the precision of the workpiece support movement. As the workpiece support is equally precise in both axes, the difference in error is wholly attributable to the characteristics of the incoming ion beam. As described above, this beam is very tightly controlled and measured in the XZ plane. However, it is neither controlled nor measured in the Y dimension. Thus, the magnitude of angular error of the former technique can be many times that of the latter technique. Furthermore, the latter technique allows for future refinements, since the ion beam parallelism in the X dimension is already measurable and controllable. Thus, further enhancements in parallelism have a corresponding effect of reducing the angular error of high tilt implantation.

This invention is not limited to only implantations consisting of 4 rotations of 90° each. The number of rotations and the amount of rotation can both be varied. For example, topologies where all the transistors have a single orientation are known in the art. With a workpiece having this topology, the implantation described above can be achieved using 2 rotations of 180° each. In this scenario, the workpiece would be implanted as shown in FIG. 7a, where all transistors are oriented in the same direction as transistor 710. The workpiece would then be rotated 180°, so as to result in the configuration shown in FIG. 7c. Since all transistors are oriented in the same direction, all transistors can be implanted in two rotations.

In another embodiment, the topology of the workpiece may be such that the various transistors are oriented in more than 2 perpendicular orientations, and therefore the workpiece must be implanted in more than 4 orientations. For example, if the workpiece had transistors oriented such that n implantations were required, the workpiece would preferably be rotated n times, where each rotation is 360/n degrees. Thus, a workpiece having transistors oriented in 8 equally spaced orientations would require 8 rotations of 45° each. While having the orientations of the transistors offset from one another by a fixed amount is preferable, it is not required. In other words, for a situation where 6 rotations are required, it may be preferable that the transistors be oriented at 0°, 60°, 120°, 180°, 240°, 300° and 360°. Thus, 6 rotations, each 60°, will serve to implant the transistors. However, the transistors can be oriented at irregular intervals, such as 0°, 30°, 120°, 180°, 210°, and 300°. In such a case, the amount of workpiece rotation is not constant.

The above description assumes a planar workpiece and uses an axis of rotation perpendicular to the surface of that workpiece. However, the invention is not so limited. In some cases, the workpiece may not be planar, or there may be an axis of greater relevance. This disclosure uses the term "rotation" to indicate that a clockwise or counterclockwise movement of the implant area of the workpiece relative to the ion beam is involved. While use of an axis perpendicular to the planar surface of the workpiece is the preferred method of rotation, other axes are possible. As long as the surface to be implanted experiences a clockwise or counterclockwise movement relative to the ion beam, this manipulation is considered a "rotation". The term "tilt" refers to the movement about an axis substantially parallel to the surface of the workpiece, preferably about an axis which is in the plane defined by the planar surface of the workpiece.

Figure 10:
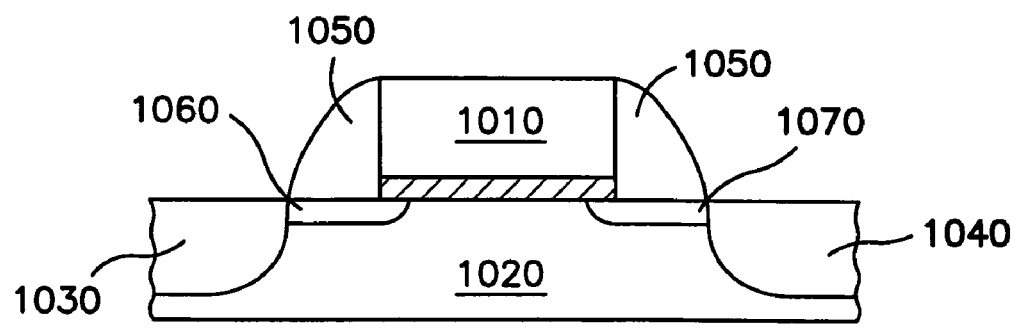
FIG. 10 shows a side view of a transistor having a source drain extension.

There are additional process features that can utilize the high precision high tilt implantation process previously described. Source drain extension is a process known to those skilled in the art, and can be performed using the present invention. FIG. 10 shows a side view of a transistor having source drain extension. The substrate 1020 is doped on either side of gate 1010 to form source 1030 and drain 1040. Spacers 1050 are created on either side of the gate 1010 so as to separate these source and drain regions from the gate. To improve the performance of the transistor, it may be desirable to extend the source and/or drain regions closer to and perhaps under the gate region 1010. Source extension 1060 extends the doped source region 1030 closer to the gate 1010, while drain extension 1070 extends the doped drain region 1040 closer to the gate 1010. Each of these extension regions can be implanted using the high tilt implantation described herein.

There may also be other device structures such as double or triple gate transistors (not shown) where precise control over beam incident angles may be a critical enabling component for the use of ion implantation. Such devices may be non-planar. In such devices, high tilt implantation may be required to selectively dope different portions of the devices and such implant processes may thus benefit from this invention.

Figure 9:
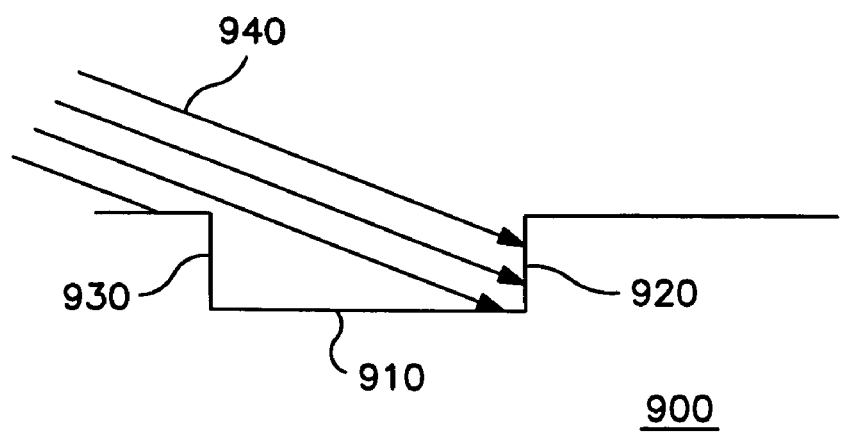
FIG. 9 shows the implantation of one wall of a trench structure in accordance with the present invention.

In addition, there are certain process steps that require high precision high tilt implantation, but do not require multiple rotations. One such process is known as single sided buried strap, which is described in U.S. Pat. No. 6,426,526 and others. Single sided buried straps are typically used in the production of dynamic ram (DRAM) cells and require the implantation to be performed at high tilt angles. Typically, a trench exists in the workpiece, and there is a need to implant only one wall of the trench. The topology of the workpiece, in conjunction with a high tilt angle implantation makes this possible. FIG. 9 shows an example of this operation. Trench 910 is created in workpiece 900. An ion beam 940, using a high tilt angle, is exposed to the workpiece 900. The topology of the trench 910 causes near wall 930 to remain shadowed, and therefore not be exposed to the ion beam 940. However, far wall 920 is exposed to the ion beam, and is therefore implanted.

To perform this process step, and many others, such as halo implantation, it is necessary to orient the workpiece so that that particular portion of the workpiece to be implanted is in a position to be exposed to the ion beam. In other words, assuming a tilt about the y-axis, far wall 920 must be oriented so as to be on the left side of the trench 910. Similarly, the description of halo implantation above assumed that the workpiece was properly oriented so that the portion of the wafer to be implanted was in a position to be exposed to the beam. In the preferred embodiment, the portion to be implanted is positioned such that it is exposed when the workpiece is tilted about an axis perpendicular to the dimension of the ion beam having the higher degree of parallelism. The use of this technique provides precisely controlled implantation angles for these operations.

One consequence of the present invention is reduced beam utilization. The scanner 650 of the ion implanter 600 creates a scanned ion beam width that is greater than the width of the workpiece to be implanted. The translational movement of the workpiece support is responsible for moving the workpiece in the Y direction such that the ion beam scans the entire workpiece. High tilt pivots about the X axis reduce the range of mechanical movement required by the workpiece, but do not affect the effective width of the workpiece.

The present invention, by pivoting the workpiece about the Y axis, can significantly affect the effective width of the workpiece that is presented to the ion beam for implantation. If a workpiece has a diameter D when presented perpendicularly to the ion beam, it will have an effective diameter of D*Cos(θ), where θ is the angle of implantation. If the desired angle of implantation is great, such as 60°, the effective diameter of the workpiece decreases significantly (e.g. D*Cos(θ), or D/2). Thus, energy and a significant portion of the ion beam are wasted since the wider beam is not impacting the workpiece. To compensate for this, the waveform applied to the scanner can be modified as a function of the angle of implantation, thereby creating a scanned ion beam that is sufficiently wide so as to scan the effective width of the workpiece, without being wasteful. Such a modification can be performed by modifying the amplitude of the waveform as a function of the angle of implantation (θ).

While the above description depicts a scanned ion beam, originating from a spot ion beam, the invention is not limited to this embodiment. Alternatively, a ribbon beam can be employed. U.S. Pat. No. 5,350,926 discloses a system with a tightly controlled ribbon beam. A ribbon beam system comprises many of the same components as were illustrated in FIG. 6. However, since the ion beam originates in the shape of a ribbon, several components, mostly notably the ion scanner, are no longer needed. However, ribbon beam systems are equally concerned with the parallelism of the ribbon beam along its width. Thus, ribbon beam systems still employ some type of parallelizing device, such as a corrector magnet or electrostatic parallelizing lens. Again, as was described with respect to the scanned ion beam, the ribbon beam is typically much more tightly controlled in one dimension. Ribbon beam systems typically control dose uniformity and parallelism in the XZ plane, while being less concerning with the Y dimension. Thus, traditional ribbon beam systems will produce ion beams having similar characteristics as scanned ion beams, in terms of controlled parallelism.

The present invention utilizes the fact that the ion beam is more tightly measured and controlled in one dimension than the other (i.e. one dimension has a higher degree of parallelism than the other), and uses this to determine the appropriate tilt axis. In most conventional ion beam implantation systems, the beam is more tightly controlled along its width (referred to as the X dimension or the XZ plane). Thus, since the preferred tilt axis is orthogonal to the plane of tightest control and the higher degree of parallelism, the most accurate angular implantation occurs by tilting the workpiece about the Y axis. However, the invention is not limited to this embodiment. For example, an additional parallelizing lens may be added to the above system so as to improve the parallelism of the ion beam in the Y dimension to such a level where it is more tightly controlled than the parallelism of the ion beamlets in the X dimension. In this scenario, it would be advantageous to pivot the workpiece about the X axis. Thus, the workpiece is tilted about an axis perpendicular to the dimension possessing the higher degree of parallelism.

By utilizing the fact that ion beams have one dimension which has a higher degree of parallelism, it is possible to greatly improve the accuracy of various implantation processes. Many state of the art processes, such as halo implantation and single sided buried straps require implantations to be performed at a high tilt angle, with great precision. By tilting the workpiece about an axis perpendicular to the dimension having the higher degree of parallelism, the angular accuracy of these processes can be greater improved.

While this invention has been described in conjunction with the specific embodiments disclosed above, it is obvious to one of ordinary skill in the art that many variations and modifications are possible. Accordingly, the embodiments presented in this disclosure are intended to be illustrative and not limiting. Various embodiments can be envisioned without departing from the spirit of the invention.

What is claimed is:

1. A method of performing high-tilt implantation, comprising:
   a. providing an ion beam having two orthogonal dimensions, said beam comprising a plurality of ion beamlets, and wherein one dimension of said ion beam has a higher degree of parallelism between said beamlets than the other dimension;
   b. tilting a workpiece having a planar surface about an axis substantially perpendicular to said dimension having said higher degree of parallelism, so as to form an angle between the surface of the workpiece and a plane perpendicular to said ion beam;
   c. exposing said workpiece to said ion beam; and
   d. rotating said workpiece in a clockwise or counterclockwise direction.

2. The method of claim 1, wherein said rotation is performed about an axis perpendicular to the planar surface of said workpiece.

3. The method of claim 1, further comprising moving said workpiece in a direction so as to expose an entirety of said workpiece to said ion beam.

4. The method of claim 1, wherein said ion beam has a width dimension and a smaller height dimension, and said higher degree of parallelism is in said width dimension.

5. The method of claim 1, wherein said angle formed by said tilting step is between about 5 and about 60 degrees.

6. The method of claim 1, wherein said exposing and rotating steps are performed a plurality of times.

7. The method of claim 6, wherein an angle of said rotation is defined as 360° divided by the number of times said rotating step is performed.

8. The method of claim 1, wherein an angle of said rotation is about 90 degrees.

9. The method of claim 1, wherein an angle of said rotation is about 180 degrees.

10. The method of claim 1, wherein said ion beam comprises a scanned ion beam.

11. The method of claim 1, wherein said ion beam comprises a ribbon beam.

12. The method of claim 1, wherein a width of said ion beam varies based on said angle formed by said tilting step.

13. A method of implanting a portion of a workpiece, comprising:
   a. providing an ion beam having two orthogonal dimensions, said beam comprising a plurality of ion beamlets, and wherein one dimension of said ion beam has a higher degree of parallelism between said beamlets than the other dimension;
   b. tilting a workpiece having a planar surface about an axis substantially perpendicular to said dimension having said higher degree of parallelism, so as to form an angle between the surface of the workpiece and a plane perpendicular to said ion beam;
   c. orienting said workpiece relative to said ion beam so as to place said portion in a position to be exposed by said beam; and
   d. exposing said workpiece to said ion beam.

14. The method of claim 13, wherein said ion beam has a width dimension and a smaller height dimension, and said higher degree of parallelism is in said width dimension.

15. The method of claim 13, wherein said portion undergoes halo implantation.

16. The method of claim 13, wherein said portion undergoes a single sided buried strap implantation.

17. The method of claim 13, wherein said portion undergoes a source-drain extension implantation.

18. The method of claim 13, wherein high tilt implantation is carried out on a portion of a non-planar device structure.

19. The method of claim 13, further comprising rotating said workpiece in a clockwise or counterclockwise direction.

20. The method of claim 19, wherein said rotation is performed about an axis perpendicular to the planar surface of said workpiece.

21. The method of claim 19, wherein said orienting, exposing and rotating steps are performed a plurality of times.

22. The method of claim 13, wherein said orienting step is performed by rotating said workpiece in a clockwise or counterclockwise direction.

23. The method of claim 22, wherein said orienting step is performed by rotating said workpiece about an axis perpendicular to the planar surface of said workpiece.

* * * * *